United States Patent
Kikuchi

(10) Patent No.: US 7,630,245 B2
(45) Date of Patent: Dec. 8, 2009

(54) SEMICONDUCTOR DEVICE AND CONTROL METHOD THEREFOR

(75) Inventor: Keiichiro Kikuchi, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 428 days.

(21) Appl. No.: 11/543,399

(22) Filed: Oct. 4, 2006

(65) Prior Publication Data
US 2007/0104016 A1    May 10, 2007

Related U.S. Application Data

(63) Continuation-in-part of application No. PCT/JP2005/018322, filed on Oct. 4, 2005.

(51) Int. Cl.
*G11C 11/34* (2006.01)
(52) U.S. Cl. ............... 365/185.18; 365/185.03; 365/185.19
(58) Field of Classification Search ............ 365/185.18, 365/185.03, 185.19; 714/154
See application file for complete search history.

(56) References Cited

U.S. PATENT DOCUMENTS

| | | | |
|---|---|---|---|
| 5,943,260 A * | 8/1999 | Hirakawa | 365/185.03 |
| 6,240,032 B1 | 5/2001 | Fukumoto | 365/222 |
| 6,366,496 B1 * | 4/2002 | Torelli et al. | 365/185.19 |
| 7,457,676 B1 * | 11/2008 | Sutardja et al. | 700/94 |
| 2003/0163656 A1 * | 8/2003 | Ganton | 711/154 |
| 2004/0071023 A1 | 4/2004 | Tanaka | 365/200 |
| 2004/0093550 A1 * | 5/2004 | Kadatch et al. | 714/752 |

FOREIGN PATENT DOCUMENTS

| | | |
|---|---|---|
| JP | 11162182 | 6/1999 |
| JP | 2002197880 | 7/2002 |
| JP | 2004103089 | 4/2004 |

\* cited by examiner

*Primary Examiner*—Son Dinh

(57) ABSTRACT

The invention is a semiconductor device that includes a memory cell array having non-volatile memory cells, and a control circuit that writes data into the memory cell array by programming memory cells to be programmed to a first level and then programming the memory cells to a second level, and its control method. According to the present invention, the time necessary for writing data can be reduced by shortening the time for programming to the first level. Further, a required data retention time can be secured by programming to the second level.

25 Claims, 11 Drawing Sheets

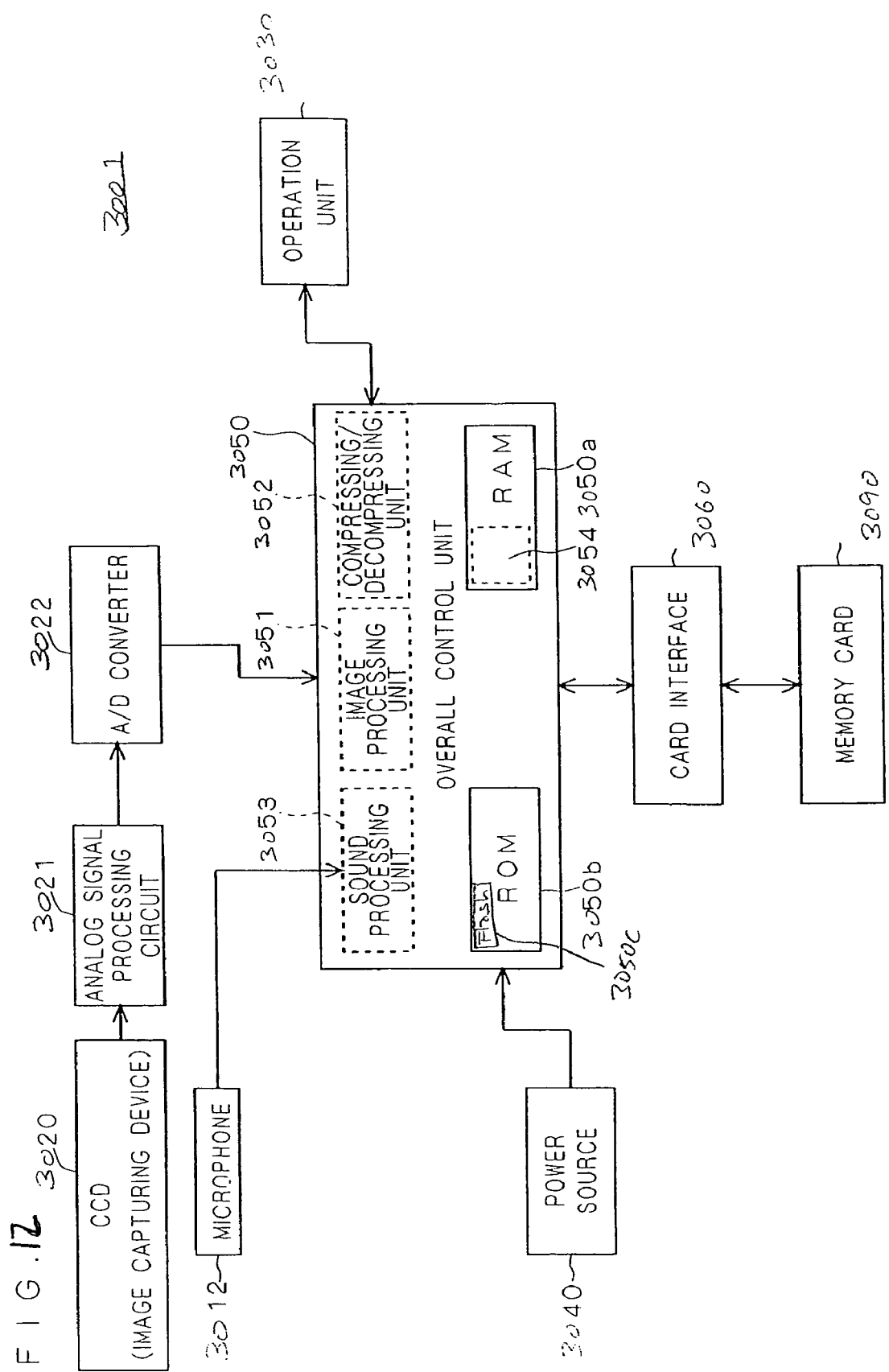

SEMICONDUCTOR DEVICE AND CONTROL METHOD THEREFOR

CROSS-REFERENCES TO RELATED APPLICATIONS

This is a continuation in part of International Application No. PCT/JP2005/018322, filed Oct. 4, 2005 which was not published in English under PCT Article 21(2).

TECHNICAL FIELD

This invention relates generally to semiconductor devices and control methods therefor, and more particularly, to a semiconductor device having a non-volatile memory cell array and a control method therefor.

BACKGROUND

In recent years, non-volatile memory semiconductor devices, in which data is rewritable, have been widely used. For instance, in a flash memory that is a typical non-volatile memory, a transistor composing a memory cell stores charge in a charge storage layer, so that data can be stored. There are two types of flash memories, namely, a floating gate type flash memory having a floating gate as the charge storage layer, and a SONOS (Silicon Oxide Nitride Oxide Silicon) type flash memory having a trap layer as the charge storage layer.

Data can be written into the memory cell (that is, charge is stored in the charge storage layer) by injecting electrons or the like in the charge storage layer. More specifically, a high voltage is applied between the source and drain of the transistor that forms the memory cell, and a positive voltage is applied to the control gate thereof. Hot electrons thus generated between the source and drain are injected into the charge storage layer, and are accumulated therein. The charge (electrons) injected into the charge storage layer raises the threshold voltage of the transistor that forms the memory cell. The threshold voltage is measured in the form of current so that the data stored therein can be read.

As long as a circuit which is an external user device of the flash memory, such as a CPU, is writing data into the flash memory, the CPU can not execute any process other than the data writing process. It is thus demanded to shorten the time it takes to write data into the memory cell in order to improve the CPU process efficiency.

Japanese Patent Application Publication No. 2002-197880 (hereinafter, Document 1) discloses a technique that selectively sets the voltages applied to the source, drain and control gate of the transistors that form the memory cells and the applied times thereof to appropriate values based on applications at the time of writing data into the memory cells.

FIG. 1($a$) (Prior Art) shows the time during which data can be retained (data retention time) as a function of data writing depth (that is, threshold voltage), and FIG. 1($b$) (Prior Art) shows the time necessary to write data (data writing time) as the function of threshold voltage. The charge stored in the charge storage layer disappears over time (that is, the data is lost). The ordinary flash memories are required to secure long-term data retention as long as 10 to 20 years at a temperature of 90 to 125° C. The long-term data retention may require a larger amount of charge in the charge storage layer. As is shown in FIG. 1($a$) (Prior Art), it is required to increase the threshold voltage of the transistors that form the memory cells. However, as is shown in FIG. 1($b$) (Prior Art), it takes a longer time to write data in order to store an increased amount of charge in the charge storage layer. At the time of writing data, as the voltage applied to the memory cell is raised, the time necessary for writing data may be shortened. However, the memory cells may be damaged. Further, the threshold voltages may be distributed in a wider range. For these reasons, it is not preferable to increase the voltage applied to the memory cell for data writing. Taking the above into consideration, if the voltage applied to the memory cell is fixed, there is a tradeoff relationship between the elongated data retention time and the reduced data writing time.

The technique described in Document 1 appropriately selects the data retention time and writing time on the basis of applications, and is not capable of securing the sufficient data retention time and reduction in the writing time.

SUMMARY

It is therefore an object of the present invention to provide a semiconductor device capable of securing the sufficient data retention time and reducing the data writing time and a method for controlling such a semiconductor device.

The present invention is a semiconductor device including: a memory cell array having non-volatile memory cells; and a control circuit that writes data into the memory cell array by programming memory cells to be programmed to a first level and then programming the memory cells to a second level. Thus, the time necessary for writing data can be reduced by shortening the time for programming to the first level. Further, a required data retention time can be secured by programming to the second level.

The present invention may be configured so that a data retention time of the memory cells programmed to the second level is longer than that of the memory cells programmed to the first level. The threshold voltages of the memory cells programmed to the second level may be greater than those of the memory cells programmed to the first level. Thus, the time necessary for programming to the first level can be reduced and a sufficient data retention time can be secured.

The present invention may be configured so that the control circuit receives a control signal supplied from an external circuit and used for programming to the second level, and then programs the memory cells to the second level. Thus, it is possible to save the processing time of the external circuit, which may, for example, be a CPU.

The present invention may be configured so that the control circuit receives the control signal after programming the memory cells into which data should be written to the first level. Thus, the programming to the second level can be executed when the control circuit is not busy.

The present invention may be configured so as to further include a storage part that stores a flag indicating that at least one memory cell in a region including said memory cells to be programmed has been programmed to the first level, wherein the control circuit reads the flag from the memory part, and programs the memory cells into which the data should be written to the second level when the flag indicates the at least one memory cell has been programmed to the first level. Thus, programming to the second level is performed only when at least one memory cell has been programmed to the first level, whereby wasteful programming can be avoided.

The present invention may be configured so that the control circuit stores the flag in the storage part when programming the at least one memory cell in the region to the first level, and clears the flag in the storage part when the memory cells in the region are programmed to the second level. Thus, it is thus possible to appropriately store, in the storage part, the flag indicating that at least one memory cell in the region has been programmed to the first level.

The present invention may be configured so that the control circuit reads data from memory cells in a region including the memory cells into which the data should be written, and programs the memory cells that have been programmed to the first level among said memory cells, so that the memory cells into which the data should be written can be programmed to the second level. Thus, the memory cells can be programmed to the second level without any instruction of the address supplied to the external circuit and received by the control circuit.

The present invention may be configured so that the region includes the whole memory cell array or a part thereof.

The present invention may be configured so that: the memory cell array includes multiple regions; and the storage part stores flags, each of which is associated with a respective one of the multiple regions and indicates that at least one of memory cells in a corresponding one of the multiple regions has been programmed to the first level. It is thus possible to reduce the time it takes to program the memory cells in the memory cell array to the second level.

The present invention is also a method for controlling a semiconductor device equipped with a memory cell array having non-volatile memory cells, comprising the steps of: programming memory cells into which data should be written to a first level; and programming the memory cells into which the data should be written to a second level. Thus, the time necessary for writing data can be reduced by shortening the time for programming to the first level. Further, a required data retention time can be secured by programming to the second level.

The present invention may be configured so as to further include a step of receiving a control signal for programming to the second level, wherein programming the memory cells to the second level programs the memory cells to the second level in response to the control signal. Thus, it is possible to save the processing time of the external circuit, which may, for example, a CPU.

The present invention may be configured so as to further include a step of storing a flag indicating that at least one memory cell in a region including said memory cells to be programmed has been programmed to the first level, wherein programming the memory cells to the second level includes steps of reading the flag from the memory part, and programming the memory cells into which the data should be written to the second level when the flag indicates the at least one memory cell has been programmed to the first level. Thus, programming to the second level is performed only when at least one memory cell has been programmed to the first level, whereby wasteful programming can be avoided.

According to the present invention, it is possible to provide a semiconductor device capable of securing a satisfactory data retention time and reducing the writing time and its control method.

BRIEF DESCRIPTION OF THE DRAWINGS

Other objects, features and advantages of the present invention will become more apparent from the following detained description when read in conjunction with the accompanying drawings, in which:

FIG. 12 illustrates an exemplary digital camera, in accordance with an embodiment of the present claimed subject matter.

DETAILED DESCRIPTION

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it will be evident to one of ordinary skill in the art that the present claimed subject matter may be practiced without these specific details. In other instances, well known methods, procedures, components, and circuits have not been described in detail as not to unnecessarily obscure aspects of the claimed subject matter.

First, the principles of the present invention will be described with reference to FIGS. 2(a) through 2(c).

Figure 2A:
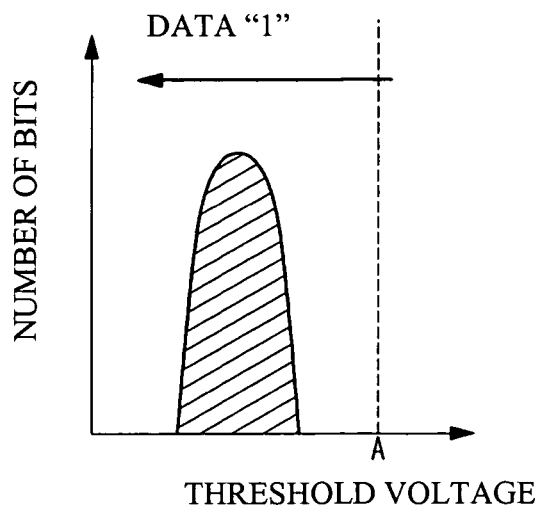
FIGS. 2(a), 2(b) and 2(c) are diagrams that show the principles of the present invention.

FIG. 2(a) shows a distribution of the number of memory cells (the number of bits) for the threshold voltages of transistors that form memory cells in a memory cell array that are in an erased state (data of "1") in which no charge is stored in each memory cell. In this figure, "A" is the threshold voltage for determining whether data stored in the memory cell is "1" or "0". Each memory cell having a threshold voltage lower than A has a state in which data "1" has been written, and each memory cell having a threshold voltage higher than A has a state in which data "0" has been written. FIG. 2(a) shows that all of the memory cells have data "1".

Figure 1A:
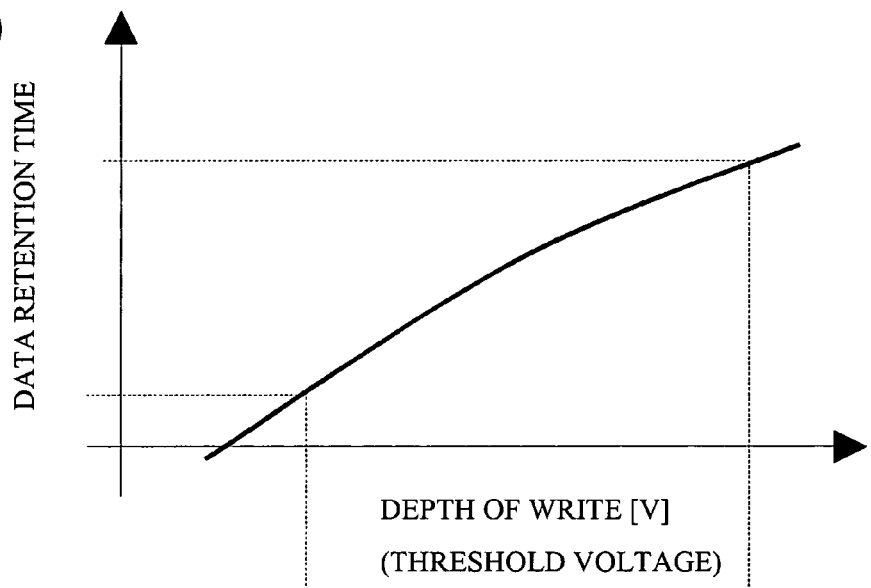
FIG. 1(a) (Prior Art) schematically shows a relationship between a threshold voltage and a data retention time.
Figure 1B:
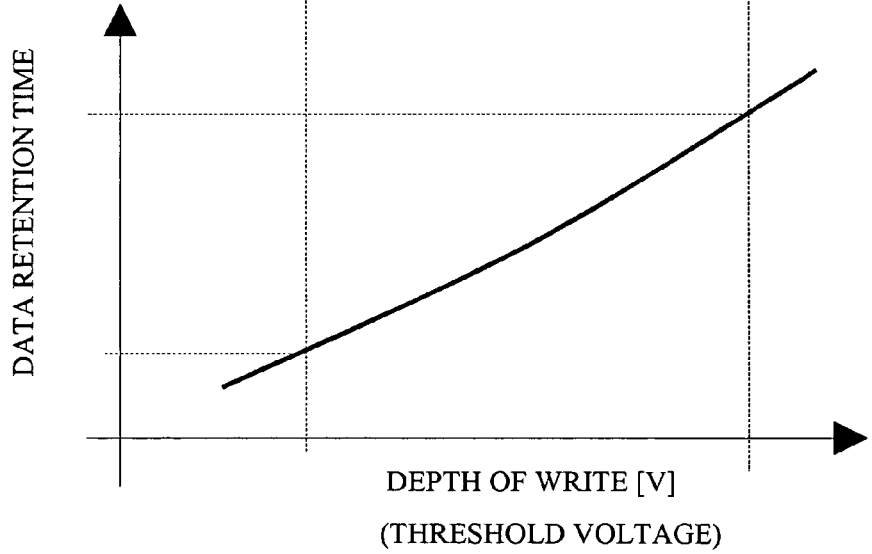
FIG. 1(b) (Prior Art) schematically shows a relationship between a threshold voltage and a write time.
Figure 2B:
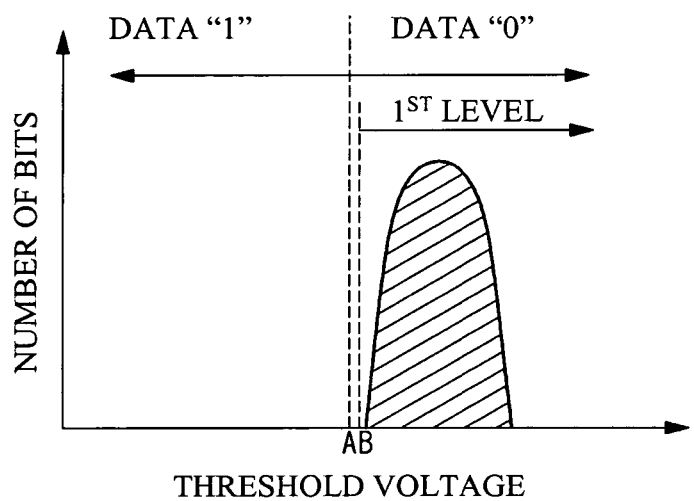
Figure 2C:
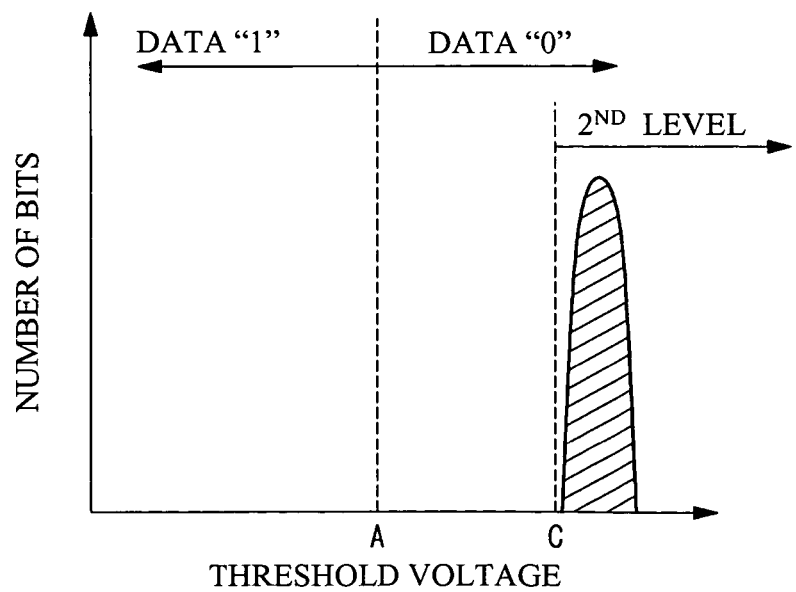

Next, each memory cell into which data "0" should be written (FIGS. 2(a) and 2(b) show a case where data "0" is written into all the memory cells) is programmed to a first level. FIG. 2(b) shows a distribution of the number of memory cells (the number of bits) for the threshold voltages of the memory cells that have been programmed to the first level. The threshold voltages higher than "B" show that the memory cells have been programmed to the first level. The threshold voltage B is very close to A. Thus, although the data retention time is short, the data writing time is short due to the relationship shown in FIG. 1(a). In this manner, the memory cells are programmed at the first level at which a short programming time is available although the data retention time is short. For example, the memory cells that have been programmed to the first level may be capable of retaining data for a few minutes to a few days.

At any time at which the data retention time at the first level has not yet passed after the writing at the first level, the memory cells are programmed to a second level. FIG. 2(c) shows a distribution of the number of memory cells (the number of bits) for the threshold voltages of the memory cells that have been programmed to the second level. The threshold voltages higher than C show that the memory cells have been programmed to the second level. The threshold voltage C is very away from the threshold level A. Thus, the data retention can be lengthened from the relationship shown in FIG. 1(a) (Prior Art). The data retention times of the memory cells that have been programmed to the second level are assumed as a data retention time required for the flash memories.

As described above, in writing data in the flash memory by the CPU, the memory cells are programmed to the first level with a short writing time. Thereafter, at any time, the memory cells are programmed to the second level, so that the sufficient long data retention time can be secured. The memory cells may be programmed to the second level without restraining the processing time of the CPU, so that the processing time of the CPU can be reduced.

FIRST EMBODIMENT

Figure 3:
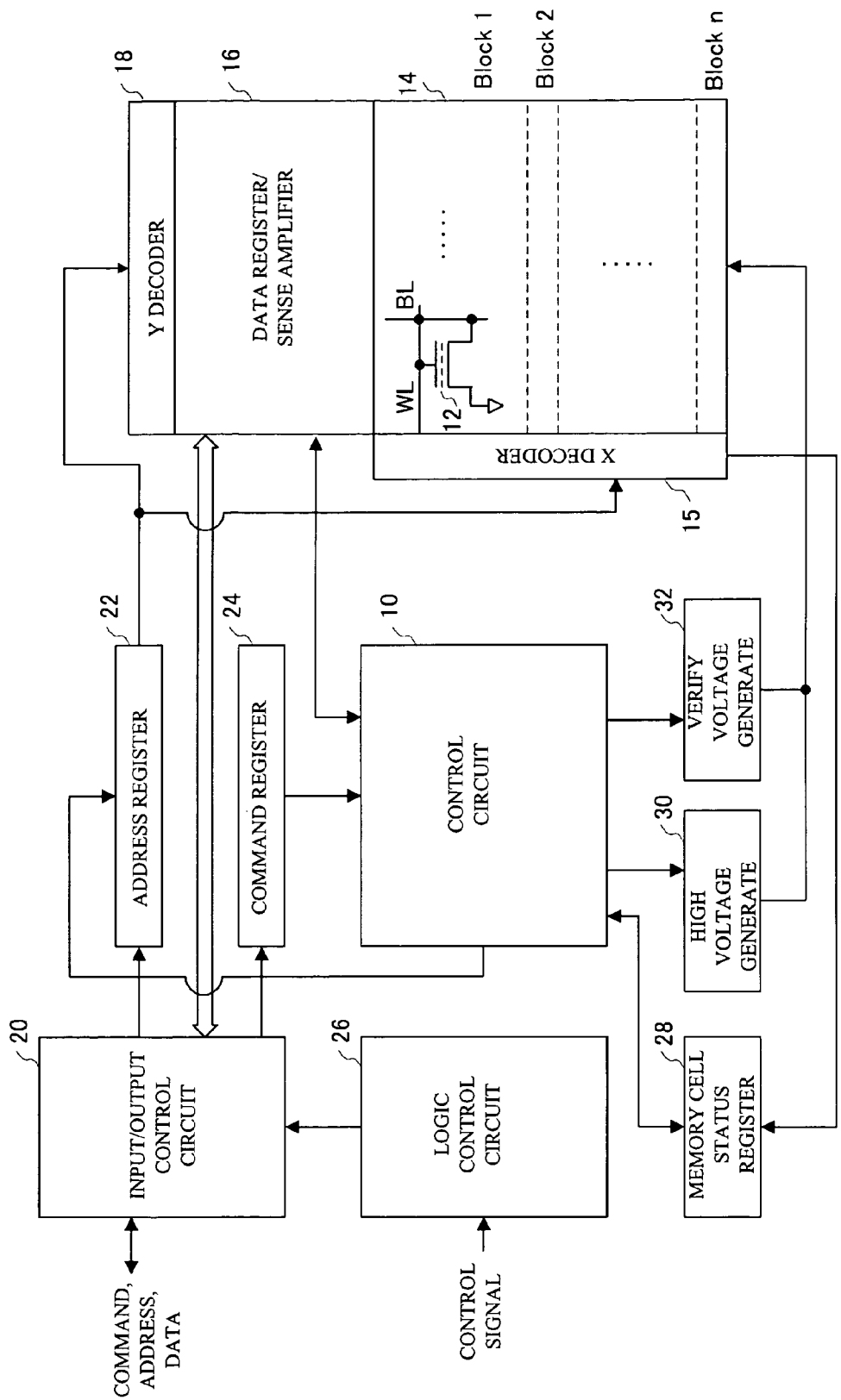
FIG. 3 is a block diagram of a flash memory according to a first embodiment.

A first embodiment of the present invention will now be described. The first embodiment is an exemplary flash memory. FIG. 3 is a block diagram of the flash memory in accordance with the first embodiment. A plurality of flash memory cells 12 that are non-volatile memory cells are arranged in rows and columns in a memory cell array 14. The control gates of transistors that form the memory cells 12 are connected to word lines WL, and the drains thereof are connected to bit lines BL, the sources being connected to source lines. The memory cell array 14 is divided into multiple blocks 1 to n, each of which is composed of multiple memory cells.

A logic controller circuit 26 temporarily stores control signals from a user device such as a microcomputer to which the present flash memory is connected, and then applies the control signals to an input/output control circuit 20. The input/output control circuit 20 is supplied with signals supplied from the user device, which signals may contain commands and address data. The input/output control circuit 20 responds to each control signal, and outputs a command, address and data to a command register 24, an address register 22 and a data register/sense amplifier 16, respectively. Data that are input via the register/sense amplifier 16 are output to the user device.

An address register 22 outputs addresses to be selected to an X decoder 15 and a Y decoder 18 on the basis of the address received via the input/output control circuit 20. The X decoder 15 selects one of the word lines WL running in the memory cell array 14, and the Y decoder 18 selects one of the bit lines BL that run in the memory cell array 14. Thus, one of the memory cells 12 that is subjected to data reading or writing is selected. The data register/sense amplifier 16 writes data received via the input/output control circuit 20 into the selected memory cell 12. The data register/sense amplifier 16 reads data from the selected memory cell 12, and outputs it to the input/output control circuit 20.

A control circuit 10 executes various controls as will be described later, and supplies the address register 22 with the address register 22, and sends and receives data to and from the data register/sense amplifier 16. Further, the control circuit 10 instructs a high-voltage generating circuit 30 and a verify voltage generating circuit 32 to generate respective voltages. The high-voltage generating circuit 30 supplies the selected memory cell 12 under the control of the control circuit 10 with a voltage for data writing or reading. The verify voltage generating circuit 32 supplies the selected memory cell 12 under the control of the control circuit 10 with a voltage for verification.

A memory cell status register 28 is connected to the control circuit 10 and the X decoder 15, and is a memory that stores a flag. The flag shows that at least one of the memory cells 12 in the region of the memory cell array 14 including the multiple memory cells 12 has been programmed to the first level. The flag is "1" when at least one of the memory cells 12 in the region of the memory cell array 14 has been programmed to the first level, and is "0" when none of the memory cells 12 have been programmed to the first level. The region in the memory cell array 14 may be the whole memory cell array 14 or may be each of the multiple blocks in the memory cell array 14. In the first embodiment, the region is the whole memory cell array 14. In this case, only one flag is used and stored in the memory cell status register 28. In contrast, in a second embodiment that will be described later, the region is defined on the block basis. The number of flags is equal to that of the regions in which the flags equal in number of blocks can be stored.

A description will now be given, with reference to the flowcharts of FIGS. 4 and 5 and a circuit diagram of FIG. 6, of an operation of the flash memory in accordance with the first embodiment. In the first embodiment, the whole memory cell array 14 is one region, and only one flag is provided for the whole memory cell array 14. FIG. 6 is a diagram that shows eight memory cells C1 through C8 in the memory cell array 14 and is prepared for describing the operation of the present flash memory. The memory cells C1 through C8 are connected to a word line WL and bit lines BL, and are selectable by the X decoder 15 and the Y decoder 18. Symbols "1", "L1" and "L2" given below the memory cells C1 through C8 respectively denote that a state of "1" (that is, the threshold voltage is equal to or lower than A in FIG. 2(a)), a state that is at a first level but is not at a second level (that is, the threshold voltage is equal to or greater than B and is equal to or lower than C respectively shown in FIGS. 2(b) and 2(c)), and a state of the second level (FIG. 2(c)). In actuality, the memory cell array 14 includes a number of memory cells. However, in the following, the memory cell array 14 is assumed to have only eight memory cells for the sake of simplicity.

Figure 4:
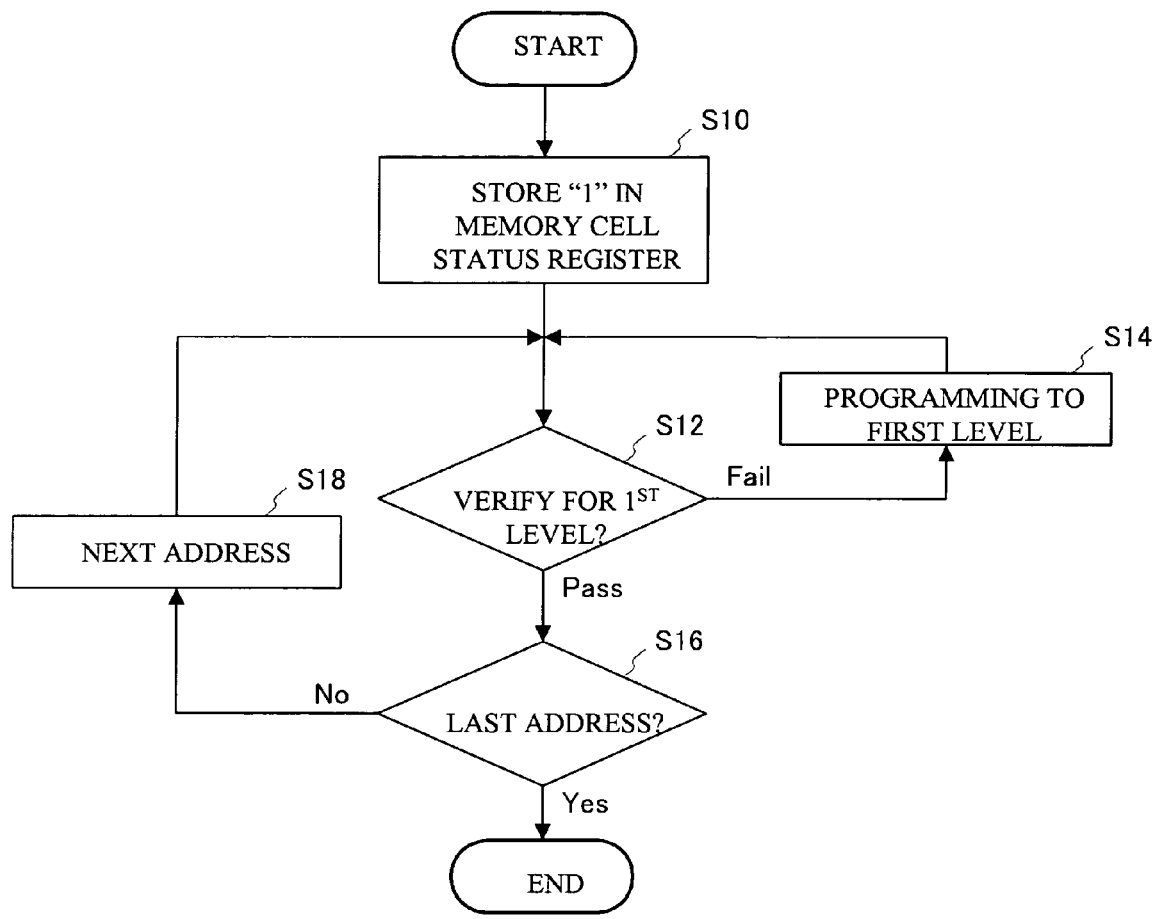
FIG. 4 is a flowchart of a sequence that is executed when a control circuit in the flash memory of the first embodiment programs a memory cell to a first level.

FIG. 4 is a flowchart of a sequence for programming the memory cells to the first level, this sequence being executed by the control circuit 10. In the initial state, flag "0" is stored in the memory cell status register 28. In FIG. 6, the second level "L2" has been written into the memory cell C7 as data "0", and the other memory cells store data "1". Referring to FIG. 4, the control circuit stores flag "1" in the memory cell status register 28 (step S10). The control circuit 10 verifies the first level of the memory cell specified by the address applied to the address register 22 via the input/output control circuit 20 by the user device (that is, the memory cell selected by the X decoder 15 and the Y decoder 18) (step S12). That is, the control circuit 10 determines whether the threshold voltage of the memory cell is equal to or greater than B. In verification, the control circuit 10 outputs a signal to the verify voltage generating circuit 32, which supplies a voltage for verification to the memory cell.

If the verification fails, that is, if the threshold voltage of the memory cell is equal or lower than B, the control circuit 10 writes the first level into the memory cell (step S14). This is done so that the control circuit 10 supplies a signal to the high-voltage generating circuit 30, which supplies the memory cell to a high voltage. When the verification passes, the process proceeds to step S16. As shown in FIG. 6, the memory cell c1 is in a state of "1", and is thus programmed to the first level "L1" (step S14). Then, the verification is performed again (step S12). At step S16, it is determined whether the last address is processed. When the address of interest is not the last address, the control circuit 10 proceeds to the memory cell C2 accessed by the next address. In this manner, the memory cells up to C8 are programmed to the first address in accordance with the address from the user device. In the exemplary case shown in FIG. 6, the memory cells C1, C2, C5 and C7 are to be programmed to the first level. Since the memory cell C7 is already at the second level, and is not programmed to the first level, while the memory cells C1, C2 and C5 are programmed to the first level. At step S16, when the memory cell of interest is the memory cell C8 specified by the last address, the control circuit 10 ends the process.

Figure 5:
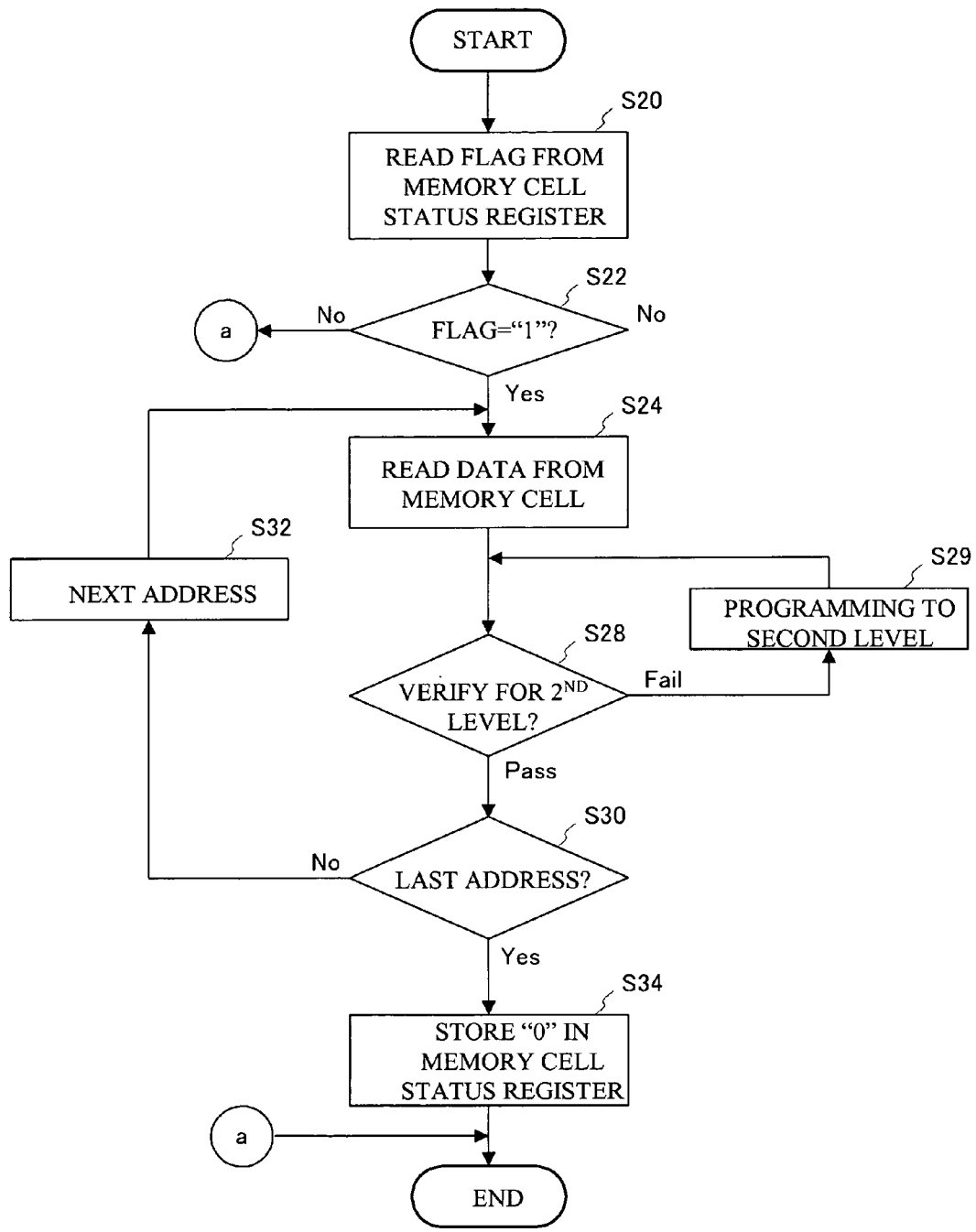
FIG. 5 is a flowchart of a sequence that is executed when the control circuit in the flash memory of the first embodiment programs the memory cell to a second level.
Figure 6:
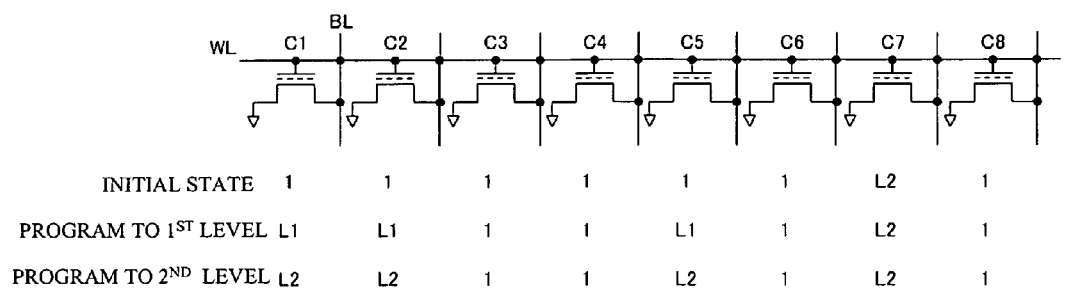
FIG. 6 show the status of memory cells in the flash memory of the first embodiment observed in steps of the programming.

FIG. 5 is a flowchart of a sequence for programming the memory cells to the second level, this sequence being executed by the control circuit 10. After the data are written into the memory cell array 14 by the user device, a control signal for writing the second level into the memory cells from the user device are applied to the control circuit via the logic controller circuit 26, the input/output control circuit 20 and the command register 24. Responsive to the control signal, the control circuit 10 executes the following. The control circuit 10 reads the flag from the memory cell status register 28 (step S20). The control circuit 10 determines whether the flag is "1" (step S22). When the flag is "0", the control circuit 10 ends the process. When the flag is "1", the control circuit 10 gives the address register 22 the initial address (that is, the address of the memory cell C1). Then, the control circuit 10 reads data stored in the memory cell selected by the X decoder 15 and the Y decoder 18 (step S24). The data read out of the memory cell is stored in the data register/sense amplifier 16.

The control circuit 10 performs the verification of the second level (step S28). In the verification, the control circuit 10 checks whether the threshold voltage of the memory cell is equal to or greater than C shown in FIG. 2(b) in a case where data in the data register/sense amplifier 16 is "0". When the verification fails, that is, when the threshold voltage of the memory cell is equal to or lower than C, the control circuit 10 programs the memory cell to the second level (step S29), and performs the verification again (step S28). As in the case of the steps S12 and S14 shown in FIG. 4, in steps S28 and S29, the control circuit 10 instructs the verify voltage generating circuit 32 and the high-voltage generating circuit 30 to apply voltages to the memory cell. When the verification passes, the control circuit 10 proceeds to step S30 at which it is determined whether the address of interest is the last address. When the address is not the last address, at step S32, the control circuit 10 proceeds to the memory cell C2 specified by the next address. In this manner, the process is repeated until the memory cell C8 is processed. In the exemplary case of FIG. 6, the memory cells C1, C2, C5 and C7 that have been programmed to the first level "L1" are programmed to the second level "L2". Since the memory cell C7 is already programmed to the second level "L2" prior to the verification (step S28), programming of the memory cell C7 to the second level "L2" (step S29) is not carried out. At step S30, when the memory cell specified by the last address is processed, the control circuit 10 resets the flag in the memory cell status register 28 to "0" (step S34), and ends the process.

Figure 7A:
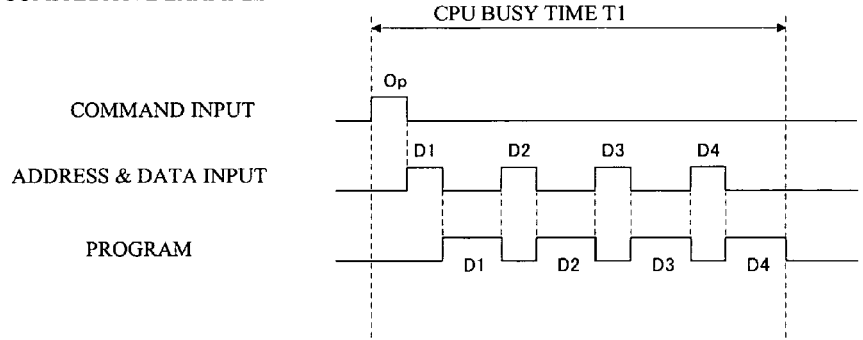
FIGS. 7(a) and 7(b) are timing charts of an operation of the flash memory of the first embodiment.
Figure 7B:
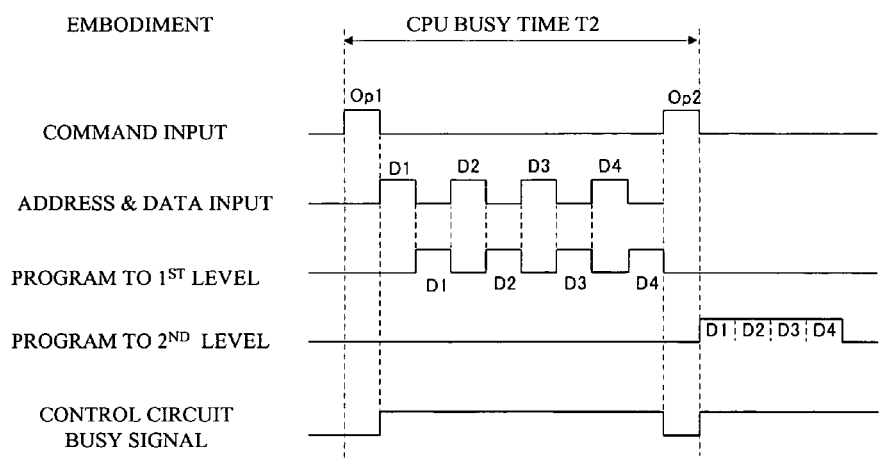

FIGS. 7(a) and 7(b) are timing charts of data storing operations of a comparative example and the first embodiment for describing the effects of the first embodiment. Referring to FIG. 7(a), the comparative example writes data without separately using the first and second levels. A command Op for writing data is applied to the flash memory of the comparatively example by the user device, which may, for example, a CPU. Next, a write address and data D1 are applied to the flash memory by the user device. Then, data D1 is written into a memory area in the memory cell array specified by the applied address. Similarly, data D2, D3 and D4 are written into the memory areas specified by the applied addresses. Until data D4 is written into the memory cell array, the user device CPU is continuously busy and is not allowed to execute another process. The CPU is busy for a time T1.

Referring to FIG. 7(b), a command Op1 for writing data by the user device is applied to the flash memory of the present embodiment. Next, the write address and data D1 are applied to the flash memory by the user device. Then, the memory cell of the specified address D1 is programmed to the first level. Similarly, the memory cells of the specified addresses D2, D3 and D4 are programmed to the first level. While the memory cells D2, D3 and D4 are being programmed to the first level, the control circuit 10 outputs a control circuit busy signal that indicates the control circuit 10 is in the busy state. When the busy signal is turned OFF, the user device supplies the control circuit 10 with another control signal Op2 for programming to the second level. The control circuit 10 programs the memory cells specified by the addresses D1 through D4 to the second level. The control circuit 10 outputs the control circuit busy signal while the control circuit 10 is programming the memory cells to the second level. The CPU, which is the user of the flash memory, is in the busy state until the command Op2 is output after the command Op1 is output, namely, during a period of time T2. According to the first embodiment, the time for programming to the first level is shortened, and programming to the second level is carried out by the control circuit 10. It is thus possible to shorten the time during which the CPU is busy. In the first embodiment, the programming to the second level is carried out immediately after the programming to the first level is completed. Alternatively, the programming to the second level may be carried out at any time when the control circuit busy signal is OFF.

The flash memory of the first embodiment has the memory cell array 14 having flash memory cells. The memory cell array is programmed so that the control circuit 10 programs the memory cells to be programmed to the first level, and then programs those memory cells to the second level. The time necessary for programming to the first level can be reduced, and the data writing time can thus be reduced. The programming to the second level makes it possible to secure the data retention time required. The data retention time of the memory cells programmed to the second level is longer than that of the memory cells programmed to the first level. The threshold voltages of the memory cells programmed to the second level are greater than those programmed to the first level. It is thus possible to shorten the time for programming to the first level and the sufficient data retention time can be secured.

Further, the flash memory of the first embodiment is equipped with the memory cell status register (storage part)

28 that stores the flag indicating that at least one of the memory cells to be programmed within the region including multiple memory cells (the whore memory cell array 14 in the first embodiment). The control circuit 10 reads the flag from the memory cell status register 28 at step S20, and programs the memory cells to the second level when the read flag is "1" (indicating that the memory cells have been programmed to the first level) at step S29. It is thus possible to program the memory cells to the second level only when at least one memory cell has been programmed to the first level and to avoid wasteful programming.

When at least one memory cell in the memory cell array 14 is programmed to the first level as in the case of step S10, the control circuit 10 stores the flag in the memory cell status register (storage part) 28. When at least one memory cell in the memory cell array 14 is programmed to the second level as in the case of step S34, the control circuit 10 clears the flag in the memory cell status register 28 ("0" is stored). It is thus possible to definitely store, in the memory cell status register 28, the flag that indicates that at least one memory cell in the entire memory cell array 14 has been programmed to the first level.

When memory cells in the memory cell array 14 are programmed to the second level, the control circuit 10 reads the data from these memory cells as in the case of step S24, and programs the memory cells that have been programmed to the first level among the read memory cells to the second level. It is thus possible for the control circuit 10 to program the memory cells to the second level without receiving instructions such as addresses from the user device.

As shown in FIG. 7(b), the control circuit 10 responds to the control signal Op2 for programming the memory cells to the second level supplied from the user device (an external circuit), and actually programs the memory cells to be programmed to the second level. In this manner, the memory cells are programmed to the second level in response to the control signal Op2 at any time, so that the buy time of the CPU, which is the user device, can be reduced.

The control circuit 10 outputs the busy signal while the memory cells into which data should be written are being programmed to the first level. Thus, the control circuit 10 programs the memory cells to be programmed to the first level, and then receives the control signal Op2. It is thus possible to program the memory cells to the second level when the control circuit 10 is not busy.

SECOND EMBODIMENT

A second embodiment is an exemplary device in which the memory cell array 14 has multiple blocks (regions) and the memory cell status register 28 stores flags, each of which is associated with a respective one of blocks (regions) and indicates that at least one of memory cells in a corresponding one of the memory blocks has been programmed to the first level. The memory cell status register 28 is capable of storing the flags, each of which is associated with the corresponding one of the blocks. The programming to the first level is carried out based on the address supplied by the user device. Thus, the process similar to that shown in FIG. 4 may be used for each of the blocks, in which step S10 may store "1" in the flags respectively associated with the blocks.

Figure 8:
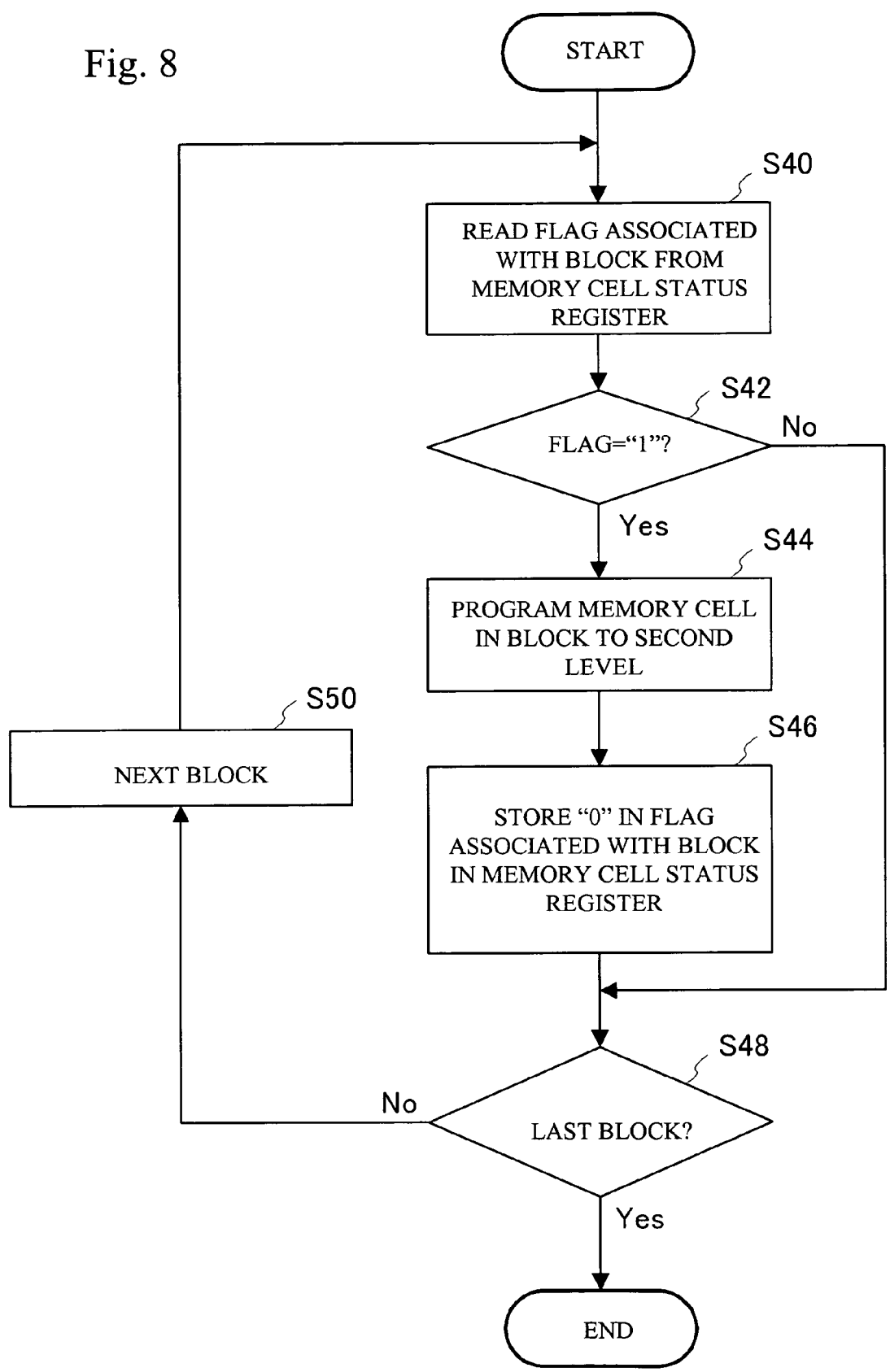
FIG. 8 is a flowchart of a sequence that is executed when the control circuit in a flash memory of a second embodiment programs a memory cell to a second level.

FIG. 8 is a flowchart of the sequence that is executed by the control circuit 10 when the memory cell array 14 is programmed to the second level. The control circuit for programming to the second level from the user is supplied to the control circuit 10. The control circuit 10 responds to the control signal, and executes the following control. The control circuit 10 reads the flag associated with the first block from the memory cell status register 28 (step S40), and determines whether the flag is "1" (step S42). When the flag is "0", the process proceeds to step S48. When the flag is "1", the control circuit 10 executes steps S24 to S30 to program the memory cells in the block to the second level (step S44). The control circuit 10 writes flag "0" associated with the present block in the memory cell status register 28 (step S46). The control circuit 10 determines whether the block being processed is the last block (step S48). If the current block is the last one, the control circuit 10 proceeds to the next block (step S50). When it is determined at step S48 that the current block is the last one, the control block 10 ends the process.

According to the second embodiment, it is determined, for each block, whether there is a memory cell that has been programmed to the first level. It is thus possible to carry out step S44 in FIG. 8, that is, steps S24 to S30 in FIG. 5 for the necessary block or blocks only. This reduces the time necessary to program the memory cells in the memory cell array 14 to the second level.

In the above-mentioned first and second embodiments, the memory cell status register 28 may be rewritten by a signal from the user device. For example, some years later, the value of the memory cell status register 28 is set to "1", and the memory cells are programmed to the second level, so that the threshold voltages of the memory cells having reduced threshold voltages can be restored to the second level.

In the above-mentioned first and second embodiments, the CPU is used as the user device (external circuit). The user device may be an operation circuit such as a CPU provided in a semiconductor device equipped with the flash memory of the first or second embodiment, or may be an operation circuit such as another CPU provided outside of a semiconductor device equipped with the flash memory. In the above-mentioned first and second embodiments, the memory cells are programmed to the second level in response to the control signal Op2 from the user device. Alternatively, the control circuit 10 may program the memory cells to the second level at an arbitrary time.

The first and second embodiments are flash memories of NOR type. The present invention includes other types of non-volatile memories such as NAND type flash memories, floating gate type flash memories and SONOS type flash memories.

In the foregoing, the memory cells are programmed to the first and second levels in the first and second embodiments. The programming includes erasing as well as data writing.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Examplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array.

Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 9:
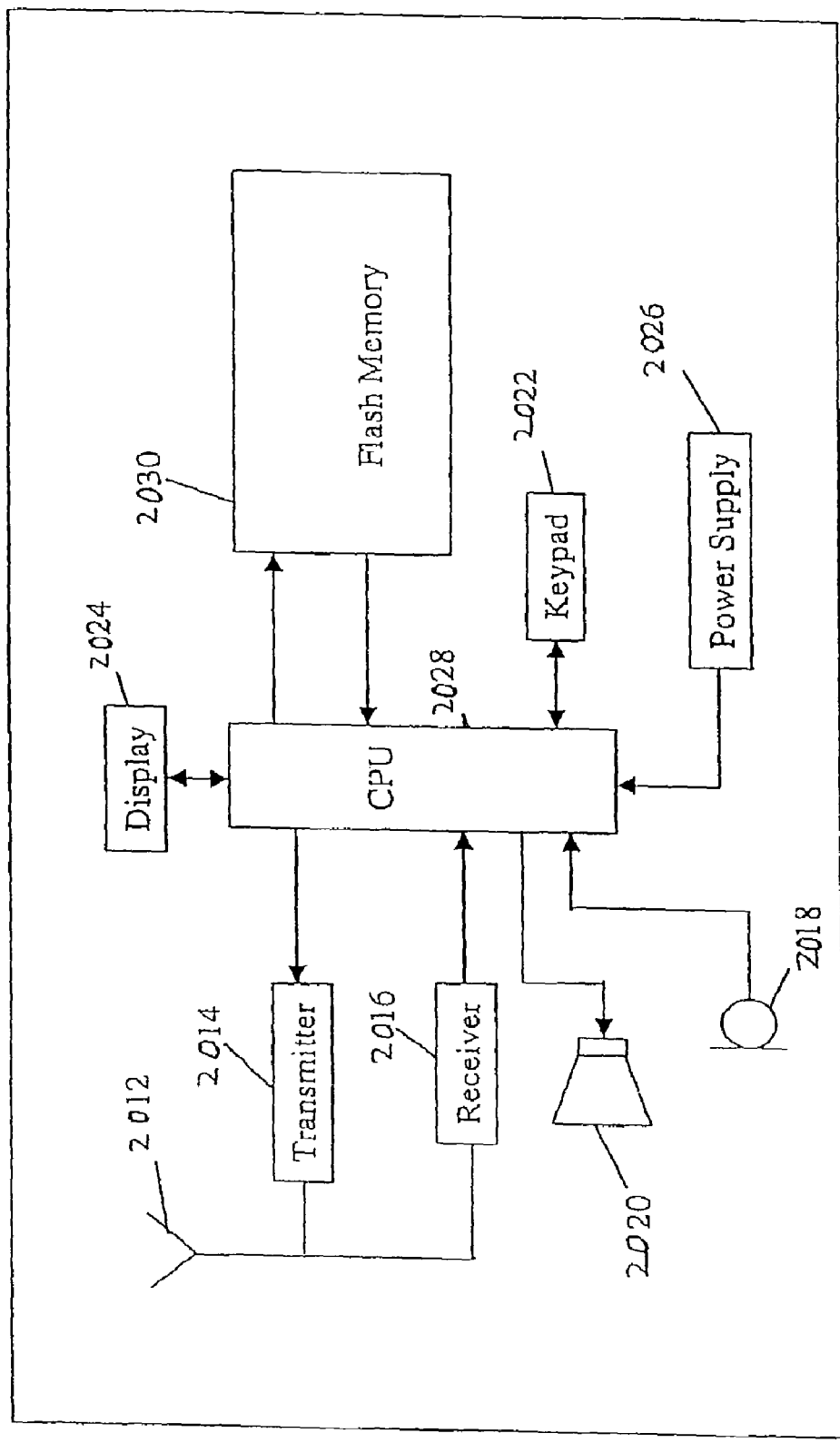
FIG. 9 illustrates a block diagram of a portable phone, upon which embodiments can be implemented.

FIG. 9 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: a memory cell array having non-volatile memory cells; and a control circuit that writes data into the memory cell array by programming memory cells to be programmed to a first level and then programming the memory cells to a second level. In this way, embodiments provide semiconductor devices in which data can be efficiently programmed in memory cells while providing a long data retention time. This improvement can affect various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 10:
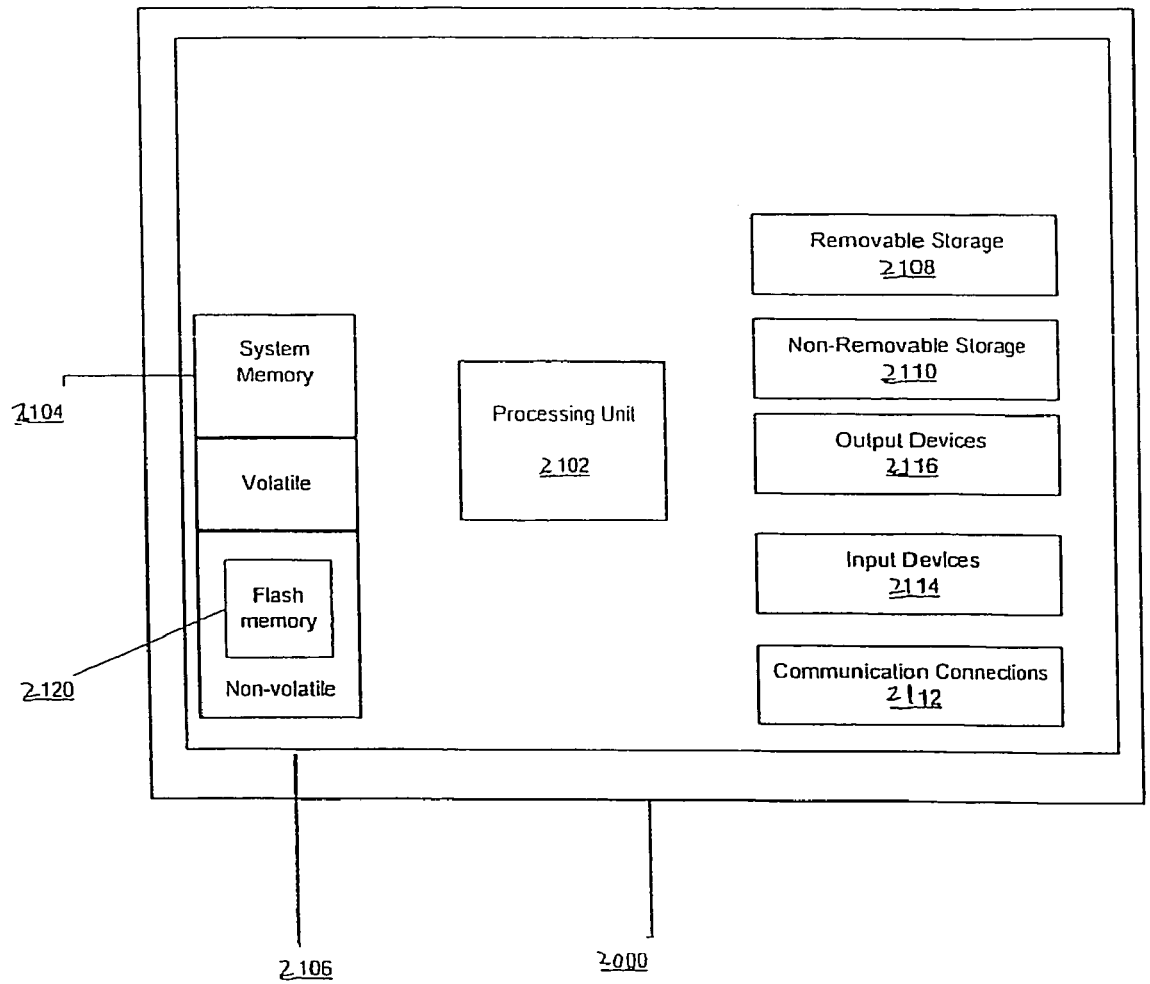
FIG. 10 illustrates a block diagram of a computing device, upon which embodiments of the present claimed subject matter can be implemented.

FIG. 10 illustrates a block diagram of a computing device 2100, upon which embodiments of the present claimed subject matter can be implemented. Although computing device 2100 is shown and described in FIG. 10 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 10.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 10 by line 2106. Additionally, device 2100 may also have additional features/functionality. For example, device 2100 may also include additional storage (removable and/or non-removable) including, but not limited to, magnetic or optical disks or tape.

In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 10 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a memory cell array having non-volatile memory cells; and a control circuit that writes data into the memory cell array by programming memory cells to be programmed to a first level and then programming the memory cells to a second level. In this way, embodiments provide semiconductor devices in which data can be efficiently programmed in memory cells while providing a long data retention time. This improvement can affect various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 11:
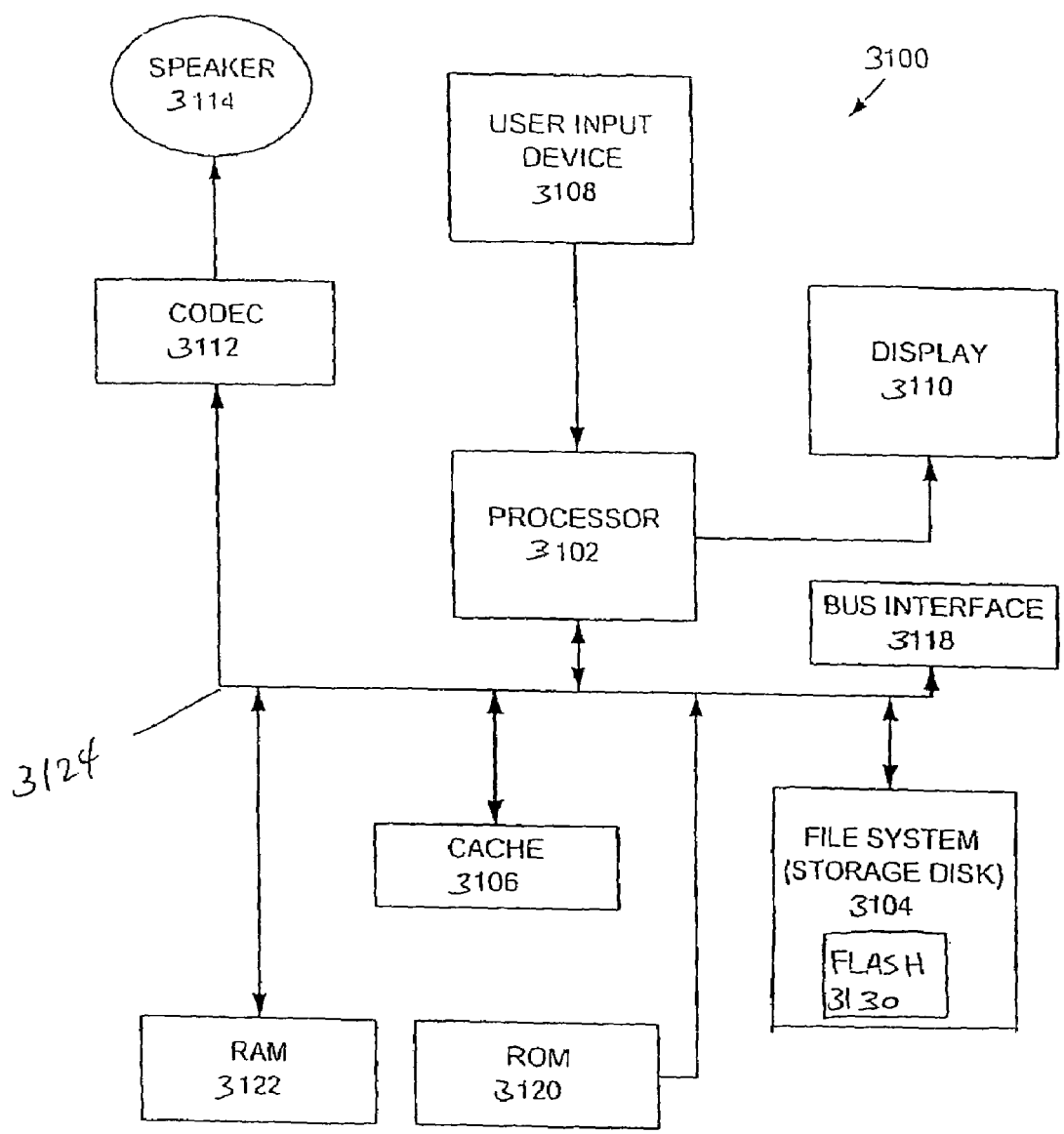
FIG. 11 illustrates an exemplary portable multimedia device, or media player, in accordance with an embodiment of the present claimed subject matter.

FIG. 11 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: a memory cell array having non-volatile memory cells; and a control circuit that writes data into the memory cell array by programming memory cells to be programmed to a first level and then programming the memory cells to a second level. In this way, embodiments provide semiconductor devices in which data can be efficiently programmed in memory cells while providing a long data retention time. This improvement can affect various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Referring to FIG. 12, the internal configuration of a digital camera 3001 is described. FIG. 12 is a block diagram showing the internal functions of the digital camera 3001. The CCD (image capturing device) 3020 functions as image capturing means for capturing a subject image and generating an electronic image signal and has, for example, 1600 times 1200 pixels. The CCD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the CCD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image signal by performing a process of reducing noise in the image signal by the correlated double sampling circuit and adjusting the gain by the automatic gain control circuit.

An A/D converter 3022 converts each of pixel signals of the image signal into a digital signal of 12 bits. The digital signal obtained by the conversion is temporarily stored as image data in a buffer memory 3054 in a RAM 3050*a*. The image data stored in the buffer memory 3054 is subjected to WB (white balance) process, gamma correction process, color correction process and the like by an image processing unit 3051 and, after that, the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050*a* and a ROM 3050*b*. When the microcomputer executes a predetermined program, the overall control unit 3050 functions as a controller for controlling the above-described components in a centralized manner. The overall control unit 3050 also controls, for example, a live view display process and a process of recording data to a memory card. The RAM 3050*a* is a semiconductor memory (such as DRAM) which can be accessed at high speed and the ROM 3050*b* takes the form of, for example, an electrically-rewritable nonvolatile semiconductor memory (such as flash ROM 3050*c*). A flash memory, in one embodiment, includes: a memory cell array having nonvolatile memory cells; and a control circuit that writes data into the memory cell array by programming memory cells to be programmed to a first level and then programming the memory cells to a second level. In this way, embodiments provide semiconductor devices in which data can be efficiently programmed in memory cells while providing a long data retention time. This improvement can affect various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050*a* functions as a buffer area for temporary storing data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 3051 is a processing unit for performing various digital imaging processes such as WB process and gamma correcting process. The WB process is a process of shifting the level of each of the color components of R, G and B and adjusting color balance. The gamma correcting process is a process of correcting the tone of pixel data. The compressing/decompressing unit 3052 is a processing unit for performing an image data compressing process and an image data decompressing process. As the compressing method, for example, the JPEG method is employed. The sound processing unit 3053 is a processing unit for performing various digital processes on sound data.

A card interface (I/F) 3060 is an interface for writing/reading image data to/from the memory card 3090 inserted into the insertion port in the side face of the digital camera 1. At the time of reading/writing image data from/to the memory card 3090, the process of compressing or decompressing image data is performed according to, for example, the JPEG method in the compressing/decompressing unit 3052, and image data is transmitted/received between the buffer memory 3054 and the memory card 3090 via the card interface 3060. Also at the time of reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050*a* or ROM 3050*b* of the overall control unit 3050. In such a manner, the control program can be updated.

Also by communication with an external device (such as an external computer) via a USB terminal, various data such as an image and sound and a control program can be transmitted/received. For example, various data, a program, and the like recorded on a recording medium (CD-R/RW or CD-ROM) which is set into a reader (optical drive device or the like) of the external computer can be obtained via the USB terminal.

A detailed description of various embodiments has been given. The present invention is not limited to the specifically described embodiments, but may include various variations and modifications within the scope of the invention as claimed.

What is claimed is:

1. A semiconductor device comprising:
   a memory cell array having non-volatile memory cells; and
   a control circuit that writes data into the memory cell array by programming memory cells of the memory cell array to a first level and then programming memory cells of the memory cell array to a second level,
   wherein the control circuit receives a control signal supplied from an external circuit that is used for programming memory cells to the second level, and then programs memory cells to the second level, wherein the control circuit receives the control signal after programming memory cells to the first level.

2. The semiconductor device as claimed in claim 1, wherein a data retention time of the memory cells programmed to the second level is longer than that of the memory cells programmed to the first level.

3. The semiconductor device as claimed in claim 1, wherein threshold voltages of the memory cells programmed to the second level are greater than those of the memory cells programmed to the first level.

4. The semiconductor device as claimed in claim 1, wherein the control circuit receives a control signal supplied from an external circuit and used for programming to the second level, and then programs the memory cells to the second level.

5. The semiconductor device as claimed in claim 4, wherein the control circuit receives the control signal after programming the memory cells into which data should be written to the first level.

6. The semiconductor device as claimed in claim 1, further comprising a storage part that stores a flag indicating that at least one memory cell in a region including said memory cells to be programmed has been programmed to the first level, wherein the control circuit reads the flag from the memory part, and programs the memory cells into which the data is written to the second level when the flag indicates the at least one memory cell has been programmed to the first level.

7. The semiconductor device as claimed in claim 6, wherein the control circuit stores the flag in the storage part when programming the at least one memory cell in the region to the first level, and clears the flag in the storage part when the memory cells in the region are programmed to the second level.

8. The semiconductor device as claimed in claim 1, wherein the control circuit reads data from memory cells in a region including the memory cells into which the data is written, and programs the memory cells that have been programmed to the first level among the memory cells, so that the memory cells into which the data is written can be programmed to the second level.

9. The semiconductor device as claimed in claim 6, wherein the region includes the whole memory cell array or a part thereof.

10. The semiconductor device as claimed in claim 6, wherein:
    the memory cell array includes multiple regions; and
    the storage part stores flags, each of which is associated with a respective one of the multiple regions and indicates that at least one of memory cells in a corresponding one of the multiple regions has been programmed to the first level.

11. A method for controlling a semiconductor device equipped with a memory cell array having non-volatile memory cells, comprising the steps of:
    programming memory cells of the memory cell array into which data is written to a first level;
    subsequently, programming the memory cells of the memory cell array into which data is written to a second level; and
    storing a flag in a region of the memory cell array indicating that at least one memory cell has been programmed to the first level, wherein programming the memory cells to the second level includes steps of reading the flag from the region, and programming memory cells to the second level when the flag indicates the at least one memory cell has been programmed to the first level.

12. The method as claimed in claim 11, further comprising a step of receiving a control signal for programming to the second level, wherein programming the memory cells to the second level programs the memory cells to the second level in response to the control signal.

13. The method as claimed in claim 11, further comprising a step of storing a flag indicating that at least one memory cell in a region including said memory cells to be programmed has been programmed to the first level, wherein programming the memory cells to the second level includes steps of reading the flag from the region, and programming the memory cells into which the data is written to the second level when the flag indicates the at least one memory cell has been programmed to the first level.

14. A wireless communications device, said wireless communications device comprising:
    a flash memory comprising:
    a memory cell array having non-volatile memory cells; and
    a control circuit that writes data into the memory cell array by programming memory cells of the memory cell array to a first level and then programming the memory cells of the memory cell array to a second level;
    wherein the control circuit receives a control signal supplied from an external circuit that is used for programming memory cells to the second level, and then programs memory cells to the second level, wherein the control circuit receives the control signal after programming memory cells to the first level,
    a processor;
    a communications component;
    a transmitter;
    a receiver; and
    an antenna connected to the transmitter circuit and the receiver circuit.

15. The wireless communications device of claim 14, wherein said flash memory is NAND flash memory.

16. The wireless communications device of claim 14, wherein said flash memory is NOR flash memory.

17. The wireless communications device of claim 14, wherein said flash memory utilizes mirrorbits technology.

18. A computing device comprising:
    a processor;
    an input component;
    an output component;
    a memory comprising:
    a volatile memory; and
    a flash memory comprising:
    a memory cell array having non-volatile memory cells; and a control circuit that writes data into the memory cell array by programming memory cells of the memory cell array to a first level and then programming memory cells of the memory cell array to a second level, wherein the control circuit receives a control signal supplied from an external circuit that is used for programming memory cells to the second level, and then programs memory cells to the second level, wherein the control circuit receives the control signal after programming memory cells to the first level.

19. The computing device of claim 18, wherein said computing device is a personal computer (PC).

20. The computing device of claim 18, wherein said computing device is a personal digital assistant (PDA).

21. The computing device of claim 18, wherein said computing device is a gaming system.

22. A portable media player comprising:
a processor:
a cache:
a user input component:
a coder-decoder component: and
a memory comprising:
a flash memory comprising:
a memory cell array having non-volatile memory cells; and
a control circuit that writes data into the memory cell array by programming memory cells of the memory cell array to a first level and then programming the memory cells to of the memory cell array to a second level, wherein the control circuit receives a control signal supplied from an external circuit that is used for programming memory cells to the second level, and then programs memory cells to the second level wherein the control circuit receives the control signal after programming memory cells to the first level.

23. The portable media player of claim 22, wherein said portable media player is a portable music player.

24. The portable media player of claim 22, wherein said portable media player is a portable video player.

25. An image capturing apparatus comprising:
a sensor for providing image data;
a memory capable of storing said image data, comprising:
a memory cell array having non-volatile memory cells; and
a control circuit that writes data into the memory cell array by programming memory cells of the memory cell array to a first level and then programming the memory cells of the memory cell array to a second level wherein the control circuit receives a control signal supplied from an external circuit that is used for programming memory cells to the second level, and then programs memory cells to the second level, wherein the control circuit receives the control signal after programming memory cells to the first level;
a display operable to display an image from said image data.

* * * * *